(12) United States Patent
O'Dwyer

(10) Patent No.: US 6,489,911 B1
(45) Date of Patent: Dec. 3, 2002

(54) DIRECT DIGITAL WAVEFORM SYNTHESIZER WITH DAC ERROR CORRECTION

(75) Inventor: Thomas G. O'Dwyer, Clonlara (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/974,489

(22) Filed: Oct. 10, 2001

(51) Int. Cl.[7] .................................................. H03M 1/84
(52) U.S. Cl. ........................................ 341/144; 341/140
(58) Field of Search ................................. 341/144, 140, 341/118, 120, 153

(56) References Cited

U.S. PATENT DOCUMENTS 5,638,073 A * 6/1997 Grotz ........................ 341/144

OTHER PUBLICATIONS

Kroupa, Venceslav F., "Introduction and Tutorial", and "Synthesis Techniques" pp 1–15 of *Direct Digital Frequency Synthesizers*, IEEE Press, N.J, 1999.
Rebeschini, Mike and Ferguson, Paul F., Jr., "Analog Circuit Design for Delta–Sigma DACs", Chapter 12, pp 380–405 of *Delta–Sigma Data Converters*, IEEE Press, N.J. 1997.

* cited by examiner

*Primary Examiner*—Brian Young
(74) *Attorney, Agent, or Firm*—Iandiorio & Teska

(57) ABSTRACT

A direct digital waveform synthesiser with DAC error correction includes a digital to analog converter system for producing a desired output waveform and having between its digital and analog output a characteristic having a linear component and a non-linear component; and a phase to amplitude converter including a storage device responsive to phase inputs to provide to the digital to analog converter system amplitudes modified to compensate for the non-linear component of a characteristic of the digital to analog converter system.

9 Claims, 4 Drawing Sheets

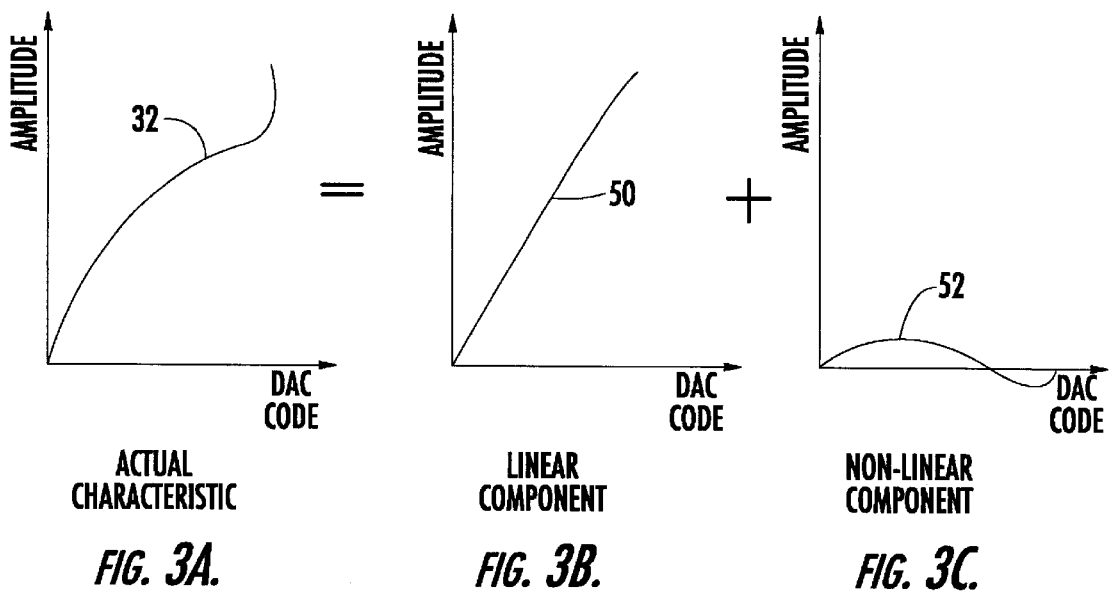
ACTUAL CHARACTERISTIC
FIG. 3A.
LINEAR COMPONENT
FIG. 3B.
NON-LINEAR COMPONENT
FIG. 3C.
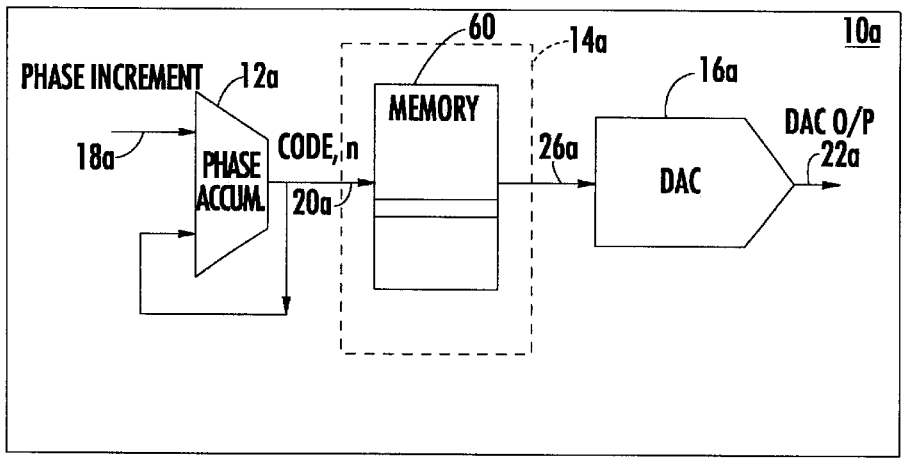
FIG. 4.

DIRECT DIGITAL WAVEFORM SYNTHESIZER WITH DAC ERROR CORRECTION

FIELD OF THE INVENTION

This invention relates to a direct digital waveform synthesiser with digital to analog converter (DAC) error correction.

BACKGROUND OF THE INVENTION

A complete direct digital synthesiser (DDS) generates phase angles, based on a user-defined increment, which are converted to amplitude signals in the form of binary words which are submitted to a DAC to generate an analog output waveform typically in the form of a sine wave. The main "figure of merit" for a complete DDS chip is related to the purity of the sine wave output, and is usually measured as spurious-free dynamic range (SFDR), i.e. the decibel level, below the desired fundamental frequency amplitude, at which the first unwanted frequency occurs in the output spectrum. See Venceslav F. Kroupa "Synthesis Techniques" in "Direct Digital Frequency Synthesisers" IEEE Press, N.J., 1999.

Usually, the limiting factor to SFDR performance on such chips is the nonlinearity of the DAC block, which in turn is limited by the analog components which constitute it—usually current source arrays. Digital techniques have been, and continue to be developed to alleviate the DAC accuracy problem, such as "Barrel shifting", sigma delta, and other techniques. See Rebeschini and Ferguson "Analog Circuit Design for Sigma Delta DACS" in "Delta Sigma Data Converters", IEEE Press, 1996. These in effect average out the errors over a large number of cycles of the Sinewave. However, the instantaneous error at any time instant is still determined by the DAC performance. Averaging techniques have other shortcomings as well: they require additional current sources and power.

SUMMARY OF THE INVENTION

It is therefore a primary object of this invention to provide an improved direct digital waveform synthesiser with digital to analog converter (DAC) error correction.

It is a further object of this invention to provide such an improved direct digital waveform synthesiser with digital to analog converter (DAC) error correction which requires less power and fewer components.

It is a further object of this invention to provide such an improved direct digital waveform synthesiser with digital to analog converter (DAC) error correction which reduces instantaneous error and enables DAC resolution to be extended from ten bits to twelve bits or more and permits a corresponding increase in phase resolution.

The invention results from the realisation that a truly effective, more accurate DDS can be achieved by correcting the error in the DAC by providing to the DAC amplitudes modified to compensate for the non-linear component of the characteristic of the DAC.

This invention features a complete direct digital waveform synthesiser with DAC error correction including a digital to analog converter system for producing a desired output waveform and having between its digital input and analog output a characteristic having a linear component and a non-linear component. There is a phase to amplitude converter including a storage device responsive to phase inputs to provide to the digital to analog converter system amplitudes modified to compensate for the non-linear component of the characteristic of the digital to analog converter system.

In a preferred embodiment the storage device may include a non-volatile memory. The storage device may include an EEPROM. The storage device may include a first storage unit responsive to the phase inputs for storing the modified amplitudes and a second storage unit for loading the modified amplitudes in the first storage unit. The first storage unit may be volatile memory and the second storage unit may be non-volatile memory. The storage device may include an ideal storage unit for storing the ideal amplitudes for a desired output waveform from the digital to analog converter system. There may be an error storage unit for storing the error compensation amplitudes corresponding to the non-linear component of the characteristic and the phase to amplitude converter may further include an arithmetic circuit for combining the ideal amplitudes and error compensation amplitudes to generate the modified amplitudes. The ideal storage unit may provide ideal amplitudes as a binary word. The error storage unit may store the error corresponding to each bit position of the binary word. The phase to amplitude converter may include a detection circuit for detecting which of a predetermined set of the bits of the binary word are set to a logical one and supplying to the arithmetic circuit the amplitude corresponding to each of the bits of the predetermined set of bits set to a logical one. The predetermined set of bits may include all of the bits of the binary word. The storage device may include an ideal storage unit for storing the ideal amplitudes corresponding to the linear component of the characteristic and an error storage unit for storing the error compensation amplitudes corresponding to the non-linear component of the characteristic. The digital to analog converter system may include a primary digital to analog converter responsive to the ideal storage unit for providing an analog output containing the linear and non-linear components and a secondary digital to analog converter responsive to the error storage unit for providing an analog output. There may be a summing circuit for combining the outputs of the primary and secondary digital to analog converters to compensate for the non-linear components.

BRIEF DESCRIPTION OF THE DRAWINGS

Other objects, features and advantages will occur to those skilled in the art from the following description of a preferred embodiment and the accompanying drawings, in which:

FIGS. 3A, B and C illustrate the actual characteristic and its linear and nonlinear components;

FIG. 4 is a schematic block diagram of a direct digital waveform synthesiser with digital to analog converter error correction according to this invention;

PREFERRED EMBODIMENT

Figure 1:
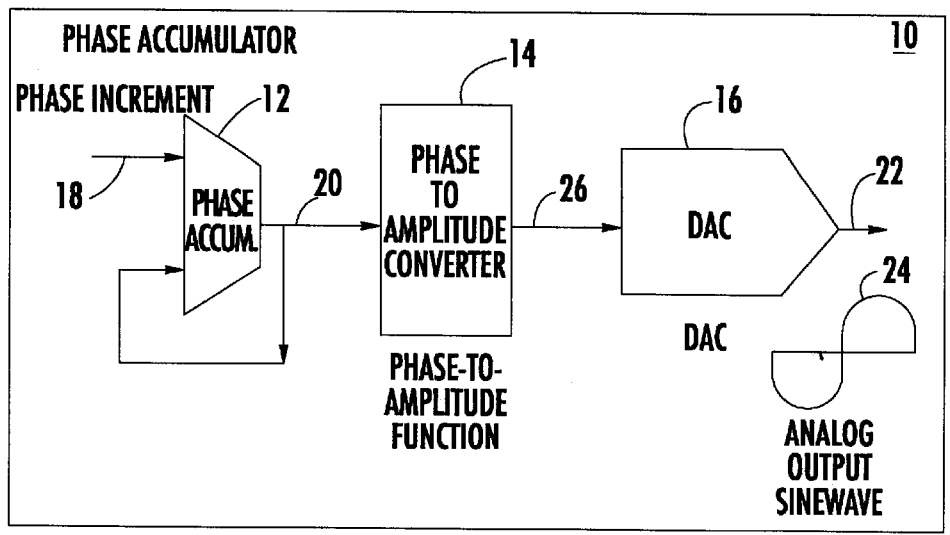
FIG. 1 is a schematic block diagram of a prior art direct digital synthesiser (DDS)

There is shown in FIG. 1 a direct digital waveform synthesiser 10 with DAC error correction including a phase accumulator 12, phase to amplitude converter 14 and a DAC 16 whose errors are to be compensated for. In operation a binary word on line 18, which can be and usually is multiple lines, delivers the phase increment to phase accumulator 12 which then delivers the next successive phase point as a binary word on input 20 to phase to amplitude converter 14. Stored in phase to amplitude converter 14 are the ideal amplitudes corresponding to a particular waveform that is desired to be constructed at the output 22 of DAC 16, for example, sine wave 24. The amplitude binary word corresponding to each of the phase points introduced at the input 20 of converter 14 appear at that input 26 to DAC 16 which then attempts to construct the sine wave 24 or some other desired wave at output 22.

While a specific waveform such as sine wave 24 is desired, it is not always attainable because of errors which occur in the direct digital synthesiser (DDS). A major source of these errors is the non-linearity of DAC 16.

Figure 2:
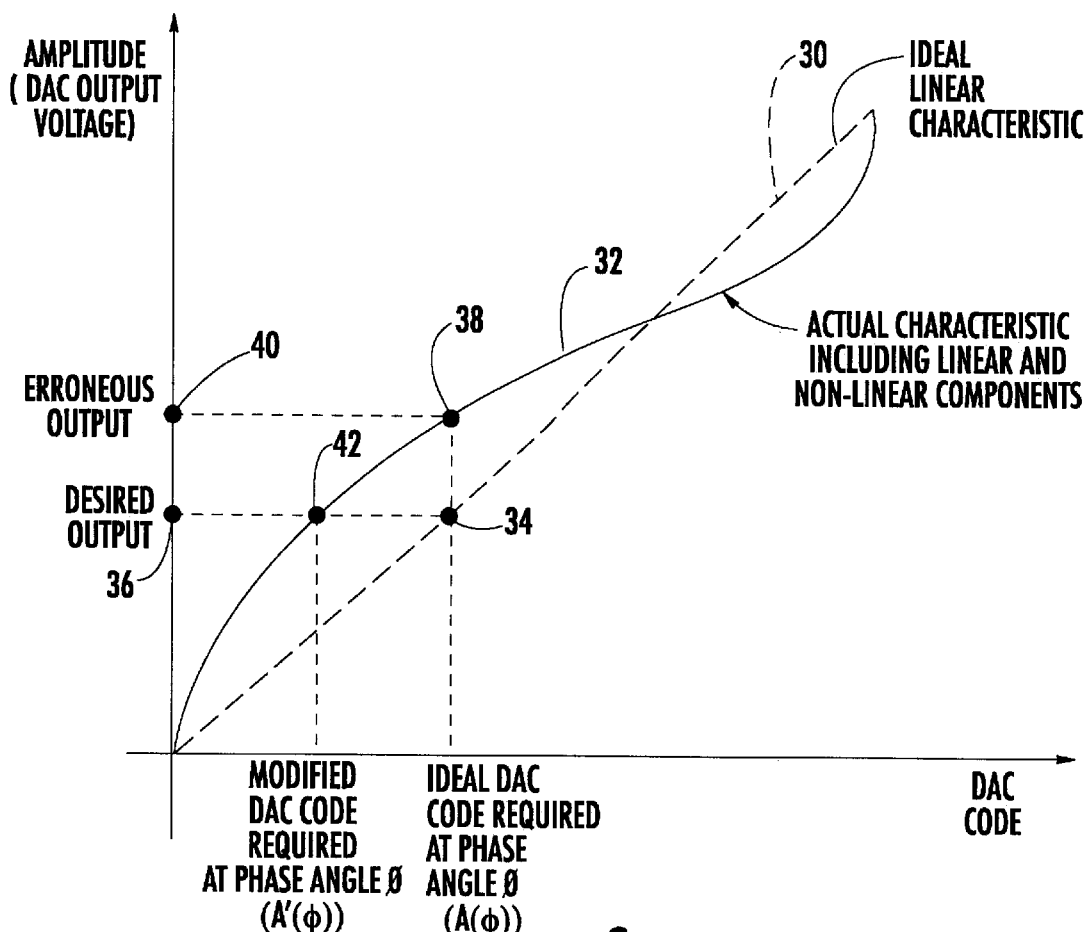
FIG. 2 illustrates the ideal linear characteristic and the actual characteristic of a DAC.

Ideally as shown in FIG. 2, DAC 16 would have a linear characteristic 30 but in fact its actual characteristic 32 is not linear and includes a non-linear component as well as a linear component. Therefore when a binary word representing a desired amplitude 36 appears at input 26 from phase to amplitude converter 14 it is the amplitude which will produce the desired sine wave co-ordinate, if DAC 16 indeed had the ideal linear characteristic 30. Thus the ideal DAC code provided to DAC 16 at phase angle Ø, namely A(Ø) would ideally access linear characteristic 30 at point 34 thereby giving the desired output amplitude at 36. However since the ideal linear characteristic 30 does not pertain and the actual characteristic 32 does, the DAC code A(Ø) actually accesses actual characteristic 32 at 38 which gives the erroneous amplitude output at 40. In accordance with this invention instead of delivering at its output the ideal DAC code required by a particular phase angle, phase to amplitude converter 14, FIG. 1, according to this invention provides a modified DAC Code A'(Ø) at that same phase angle which accesses actual characteristic 32 at point 42 and thus gives the desired output 36.

In conventional synthesisers the phase to amplitude converter generates the ideal code, A(Ø), for each phase angle Ø, assuming the DAC to have an ideal linear characteristic which it does not. To overcome this problem, in this invention the phase amplitude converter generates the modified code required, A'(Ø), for each phase angle Ø, to achieve the desired output by taking into account the error introduced by the actual characteristic 32. The actual characteristic 32, FIG. 3A, is understood as a combination of the linear component 50, FIG. 3B, and the non-linear component 52, FIG. 3C. Typically the modified DAC codes are derived from the actual characteristic 32 of the DAC 16 during manufacturing and are stored in a nonvolatile memory such as EEPROM 60, FIG. 4, in phase amplitude converter 14a. In this way in operation, each time a phase point appears at input 20a, EEPROM retrieves not the ideal DAC code, but the modified DAC code which it provides at input 26a of DAC 16a so that DAC 16a can provide a much more precise rendition of the desired waveform at the output 22a.

Figure 5:
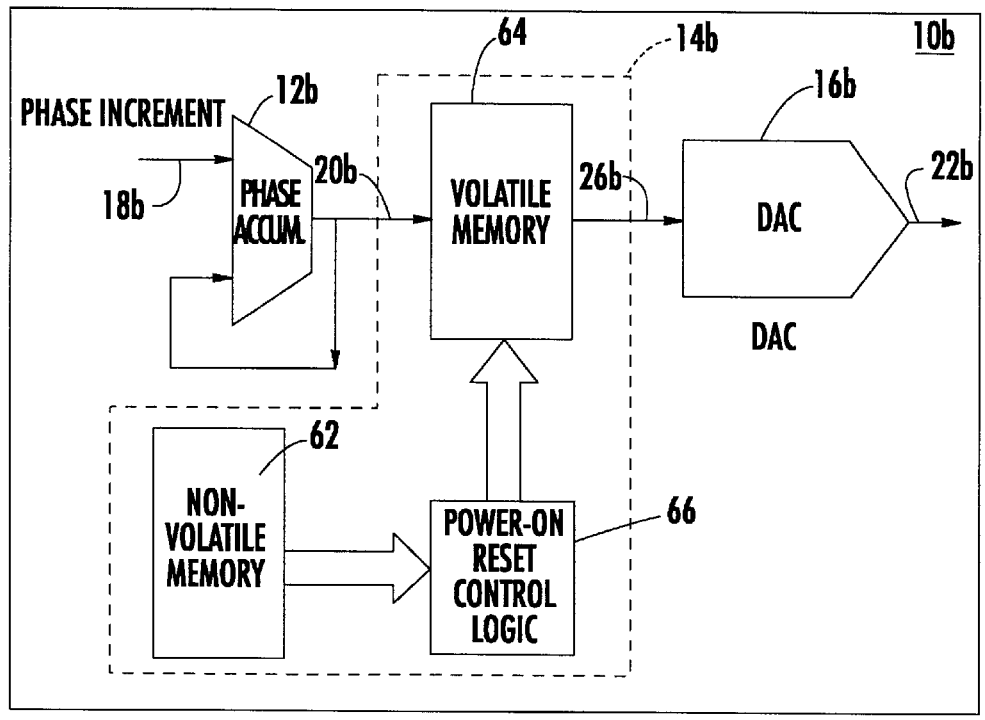
FIG. 5 is a schematic block diagram of another embodiment of a direct digital waveform synthesiser with digital to analog converter error correction according to this invention.

Since EEPROM's are somewhat slower than other forms of memory and also may have limited life, phase to amplitude converter 14b, FIG. 5, may be implemented using an EEPROM 62 which, each time the system is powered up, has the modified DAC codes stored in it loaded into a faster often volatile memory 64 by the action of power-on reset control logic 66. This is advantageous for two reasons, first it extends the life of EEPROM 62 and second it decreases the cycle time of the system since, for example, SRAM 64 has a cycle time of approximately 10 nano seconds while EEPROM 62 may have a cycle time of as much as 80 nano seconds. Depending upon the particular application any number of different memories may be used: volatile memories such as RAM, SRAM and DRAM may be used. Typically, non-volatile memories are preferred; non-volatile memories include ROM's, EPROM's, EEPROM's, laser trims, fuse trims and flash memories for example.

Figure 6:
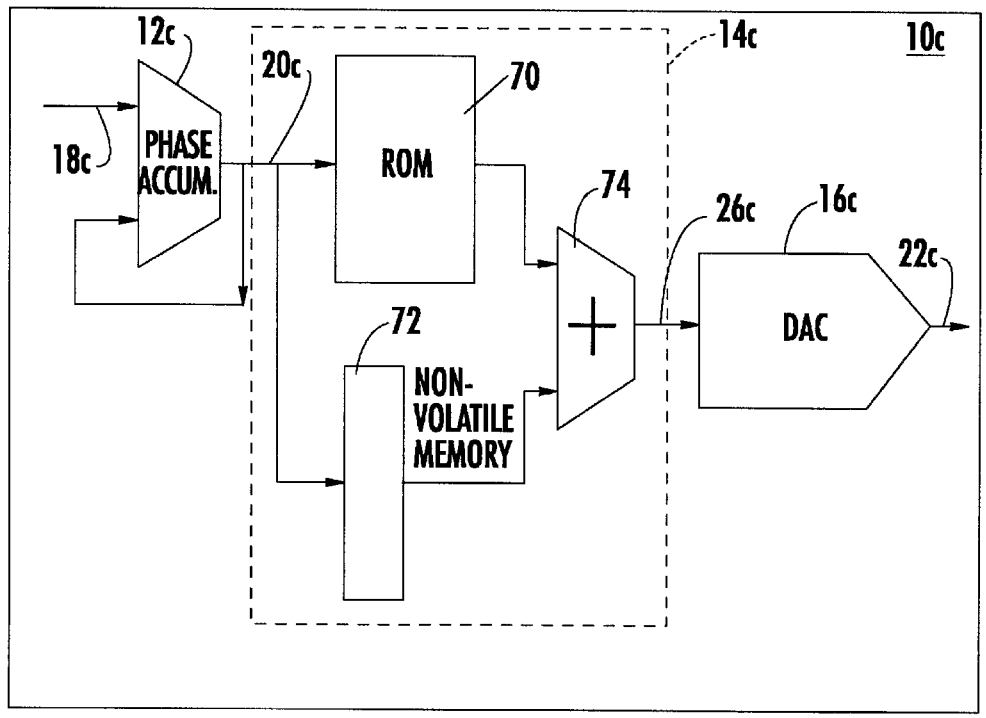
FIG. 6 is a schematic block diagram of another embodiment of a direct digital waveform synthesiser with digital to analog converter error correction according to this invention.

The EEPROM storage requirements can be substantially reduced by storing in ROM 70, FIG. 6, the DAC codes for the linear component of a characteristic of DAC 16c and storing in EEPROM 72 only the error codes associated with the non-linear components. Thus when a phase point appears at input 20c to ROM 70 and EPROM 72 the two values then are combined in arithmetic circuits 74 to produce the modified amplitude DAC code at input 26c to DAC 16c. Assuming that the ROM is 1K×10, if the DAC had 10 bit resolution and were accurate to for example 8 bits then the maximum word width required for the error would be a mere 3 bits (2 bits plus sign). Thus the EEPROM array would be reduced by over two thirds of its size to 1K×3.

Figure 7:
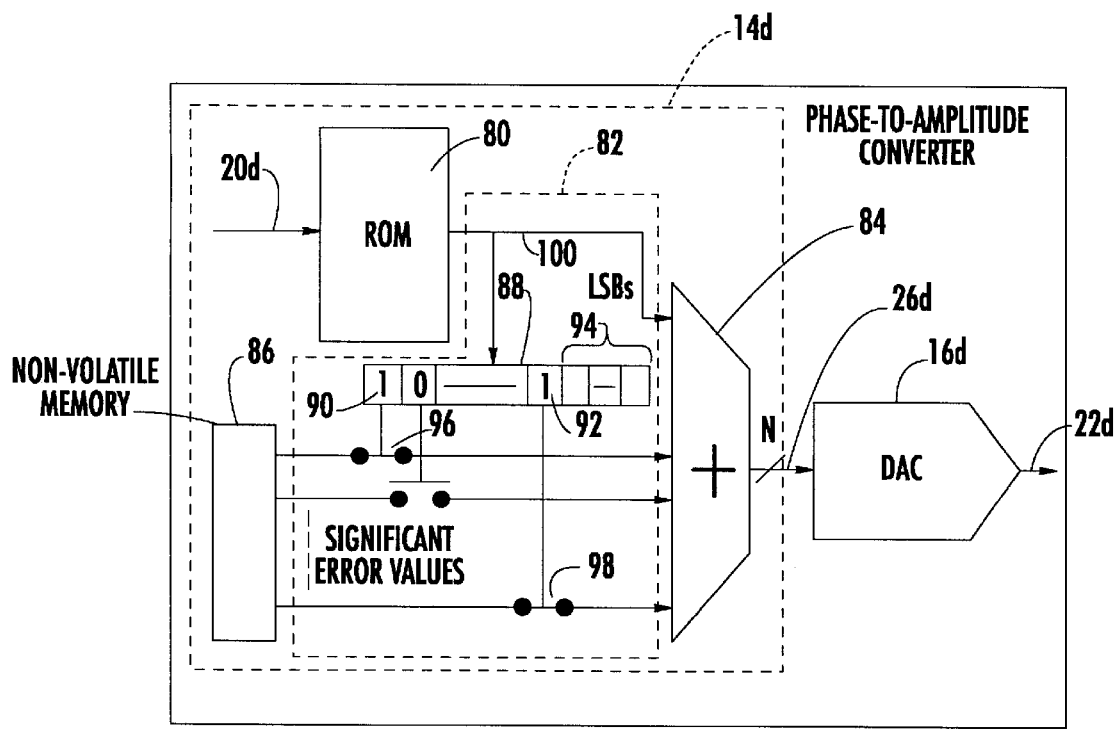
FIG. 7 is a schematic block diagram of another embodiment of a direct digital waveform synthesiser with digital to analog converter error correction according to this invention.

With the understanding that the ultimate cause of the non-linearity addressed here is due to the error associated with the bit weights, a more fundamental error compensation approach can be accomplished which effects a dramatic reduction in the amount of non-volatile storage required for errors to the point where techniques other than EEPROM become viable options. This arises by exploitation of the fact that despite the fact that errors exist for each code of the DAC, the error at any particular code is merely the sum of the errors to each of the bit weights, if super position errors are low and assuming no segmentation. By virtue of the fact of error correction, the need for segmentation, which is expensive in area and power, is significantly reduced. Where segmentation is employed, a separate error must be stored for each segment. Usually it is only errors in the first few MSBs that are significant and the lower bit weights can be ignored. Thus for a 10 bit DAC with no segmentation with maximum uncompensated errors of for example, +/−8 LSBs (i.e. 6 bit accuracy), the errors in say the top four MSBs could be considered significant and then only approximately 4×4 bits of storage would be required to store the errors. For each non-zero significant bit in the binary word from the ROM, the corresponding bit weight error whether positive or negative is summed with the code from the ROM. Such an approach is shown in FIG. 7 where ROM 80 stores the ideal DAC codes. Also included in phase to amplitude converter 14d is detection circuit 82 and arithmetic circuit 84. The storage device in addition to ROM 80 includes EEPROM 86. While ROM 80 stores the ideal amplitudes as a binary word, the EEPROM 86 stores the errors corresponding to each bit position of the binary word. Detection circuit 82 detects which of a predetermined set of the bits of the binary word are set to a logical one. For example, register 88 records the fact that the most significant bit 90 and an intermediate bid 92 are at logical one whereas the rest of the bits are not; they are at zero and the group of least significant bits 94 are not even included because their effect on the accuracy is negligible although they could be included if desired. The switches 96 and 98 associated with bits 90 and 92 are closed to deliver the error value corresponding to those bit positions to arithmetic circuit 84 where they are combined with ideal amplitudes coming from ROM 80 on line 100 (which is usually multiple lines, one per bit) to once again form the modified amplitudes at input 26*d* to DAC 16d. Switches 96 and 98 are symbolic only. In practice each switch would be a switch array or multiplexer.

Figure 8:
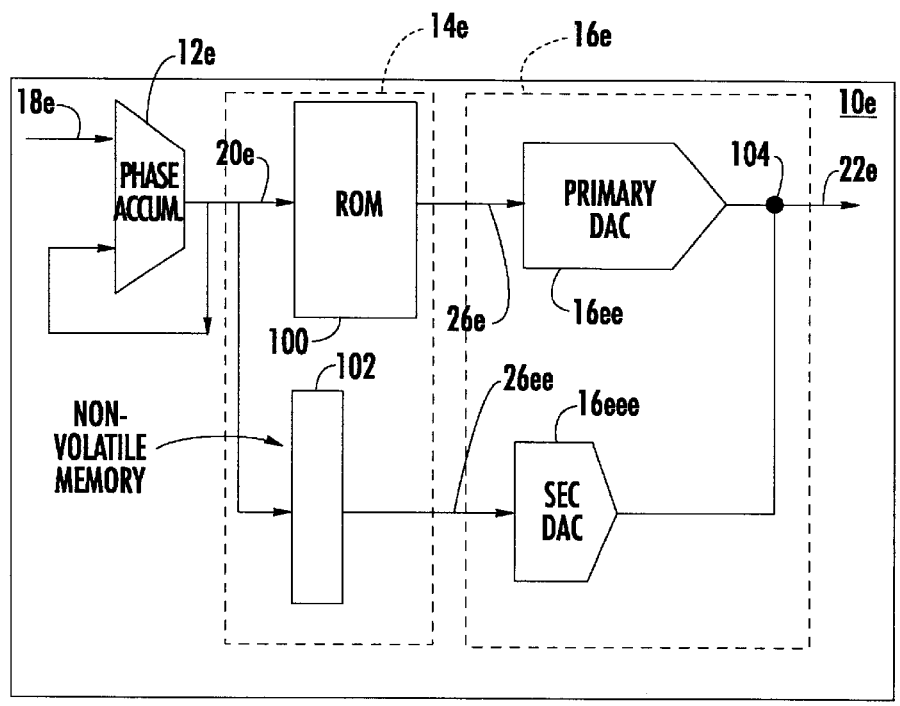
FIG. 8 is a schematic block diagram of another embodiment of a direct digital waveform synthesiser with digital to analog converter error correction using analog summation of the error according to this invention.

Although thus far, all of the compensation has been done in a digital realm this is not a necessary limitation of the invention. For example, in FIG. 8 storage device 14*e* includes an ideal storage unit, ROM 100, for storing the ideal amplitudes corresponding to the linear component of the characteristic and an error storage unit, EEPROM 102, for storing the error compensation amplitudes corresponding to the non-linear component of the characteristic. Digital to analog converter system 16*e* includes a primary digital to analog converter 16*ee* responsive to the ideal storage unit 100 for providing an analog output containing the linear and non-linear components which it delivers to summing point 104. Secondary digital to analog converter 16*eee* responds to error storage unit EEPROM 102 to provide the second analog output to the summing point 104. The two outputs of the primary and secondary digital to analog converters are combined to produce an overall linear characteristic.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A direct digital waveform synthesiser with DAC error correction comprising:

a digital to analog converter system for producing a desired output waveform and having between its digital input and analog output a characteristic having a linear component and non-linear component; and a phase to amplitude converter including a storage device responsive to phase inputs to provide to said digital to analog converter system amplitudes modified to compensate for the non-linear component of the characteristic of the digital to analog converter system.

2. The direct digital waveform synthesiser of claim 1 in which said storage device includes a non-volatile memory.

3. The direct digital waveform synthesiser of claim 1 in which said storage device includes an EEPROM.

4. The direct digital waveform synthesiser of claim 1 in which said storage device includes a first storage unit responsive to said phase inputs for storing said modified amplitudes and a second storage unit for loading said modified amplitudes in said first storage unit.

5. The direct digital waveform synthesiser of claim 4 in which said first storage unit is volatile memory and said second storage unit is non-volatile memory.

6. The direct digital waveform synthesiser of claim 1 in which said storage device includes an ideal storage unit for storing the ideal amplitudes corresponding to the linear component of the characteristic for a desired output waveform from said digital to analog converter system and an error storage unit for storing the error compensation amplitudes corresponding to the non-linear component of the characteristic and said phase to amplitude converter further includes an arithmetic circuit for combining the ideal amplitudes and error compensation amplitudes to generate the modified amplitudes.

7. The direct digital waveform synthesiser of claim 6 in which said ideal storage unit provides said ideal amplitudes as a binary word, said error storage unit stores the error corresponding to each bit position of the binary word, said phase to amplitude converter includes a detection circuit for detecting which of a predetermined set of the bits of said binary word are set to a logical one and supplying to said arithmetic circuit the error amplitude corresponding to each of the bits of the predetermined set of bits set to a logical one.

8. The direct digital waveform synthesiser of claim 7 in which said predetermined set of bits includes all of the bits of the binary word.

9. The direct digital waveform synthesiser of claim 1 in which said storage device includes an ideal storage unit for storing the ideal amplitudes corresponding to the linear component of the characteristic and an error storage unit for storing the error compensation amplitudes corresponding to the non-linear component of the characteristic, and said digital to analog converter system includes a primary digital to analog converter responsive to said ideal storage unit for providing an analog output containing said linear and non-linear components and a secondary digital to analog converter responsive to said error storage unit for providing an analog output and a summing circuit for combining the outputs of the primary and secondary digital to analog converters to compensate for the non-linear components.

* * * * *